(12) United States Patent
Bhat et al.

(10) Patent No.: US 8,450,164 B2
(45) Date of Patent: *May 28, 2013

(54) METHODS OF FORMING A PLURALITY OF CAPACITORS

(75) Inventors: Vishwanath Bhat, Boise, ID (US); Kevin R. Shea, Boise, ID (US); Farrell Good, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 343 days.

This patent is subject to a terminal disclaimer.

(21) Appl. No.: 12/710,077

(22) Filed: Feb. 22, 2010

(65) Prior Publication Data

US 2010/0151653 A1 Jun. 17, 2010

Related U.S. Application Data

(63) Continuation of application No. 11/838,070, filed on Aug. 13, 2007, now Pat. No. 7,682,924.

(51) Int. Cl.
*H01L 21/337* (2006.01)

(52) U.S. Cl.
USPC ........................................................ 438/190

(58) Field of Classification Search
USPC ........................................ 438/243, 190, 210
See application file for complete search history.

(56) References Cited

U.S. PATENT DOCUMENTS

| | | | |
|---|---|---|---|
| 4,517,729 A | 5/1985 | Batra | |
| 4,871,688 A | 10/1989 | Lowrey | |
| 5,236,860 A | 8/1993 | Fazan et al. | |
| 5,252,517 A | 10/1993 | Blalock et al. | |
| 5,340,763 A | 8/1994 | Dennison | |
| 5,401,681 A | 3/1995 | Dennison | |
| 5,467,305 A | 11/1995 | Bertin et al. | |
| 5,498,562 A | 3/1996 | Dennison et al. | |
| 5,532,089 A | 7/1996 | Adair et al. | |

(Continued)

FOREIGN PATENT DOCUMENTS

| DE | 4447804 | 1/2002 |
|---|---|---|
| JP | 4-155810 | 5/1992 |

(Continued)

OTHER PUBLICATIONS

U.S. Appl. No. 12/854,446.

(Continued)

*Primary Examiner* — Steven Loke
*Assistant Examiner* — Kimberly M Thomas
(74) *Attorney, Agent, or Firm* — Wells St. John, P.S.

(57) ABSTRACT

A method of forming a plurality of capacitors includes an insulative material received over a capacitor array area and a circuitry area. The array area comprises a plurality of capacitor electrode openings within the insulative material received over individual capacitor storage node locations. The intervening area comprises a trench. Conductive material is formed within the openings and against a sidewall portion of the trench to less than completely fill the trench. Covering material is formed over an elevationally outer lateral interface of the conductive material within the trench and the insulative material of the circuitry area. The insulative material within the array area is etched with a liquid etching solution effective to expose outer sidewall portions of the conductive material within the array area and to expose the conductive material within the trench. The conductive material within the array area is incorporated into a plurality of capacitors.

26 Claims, 13 Drawing Sheets

U.S. PATENT DOCUMENTS

| | | | |
|---|---|---|---|
| 5,604,696 | A | 2/1997 | Takaishi |
| 5,605,857 | A | 2/1997 | Jost et al. |
| 5,652,164 | A | 7/1997 | Dennison et al. |
| 5,654,222 | A | 8/1997 | Sandhu et al. |
| 5,672,534 | A | 9/1997 | Huang |
| 5,686,747 | A | 11/1997 | Jost et al. |
| 5,702,990 | A | 12/1997 | Jost et al. |
| 5,705,838 | A | 1/1998 | Jost et al. |
| 5,767,561 | A | 6/1998 | Frei et al. |
| 5,821,140 | A | 10/1998 | Jost et al. |
| 5,869,382 | A | 2/1999 | Kubota |
| 5,900,660 | A | 5/1999 | Jost et al. |
| 5,955,758 | A | 9/1999 | Sandhu et al. |
| 5,956,594 | A | 9/1999 | Yang et al. |
| 5,981,350 | A | 11/1999 | Geusic et al. |
| 5,981,992 | A | 11/1999 | Kenney |
| 5,989,953 | A | 11/1999 | Liang et al. |
| 5,990,021 | A | 11/1999 | Prall et al. |
| 6,037,212 | A | 3/2000 | Chao |
| 6,037,218 | A | 3/2000 | Dennison et al. |
| 6,059,553 | A | 5/2000 | Jin et al. |
| 6,090,700 | A | 7/2000 | Tseng |
| 6,108,191 | A | 8/2000 | Bruchhaus et al. |
| 6,110,774 | A | 8/2000 | Jost et al. |
| 6,121,084 | A | 9/2000 | Coursey |
| 6,133,620 | A | 10/2000 | Uochi |
| 6,180,450 | B1 | 1/2001 | Dennison |
| 6,204,143 | B1 | 3/2001 | Roberts et al. |
| 6,204,178 | B1 | 3/2001 | Marsh |
| 6,232,168 | B1 | 5/2001 | Coursey |
| 6,245,684 | B1 | 6/2001 | Zhao et al. |
| 6,258,650 | B1 | 7/2001 | Sunouchi |
| 6,274,497 | B1 | 8/2001 | Lou |
| 6,303,518 | B1 | 10/2001 | Tian et al. |
| 6,303,956 | B1 | 10/2001 | Sandhu et al. |
| 6,323,528 | B1 | 11/2001 | Yamazaki et al. |
| 6,329,683 | B2 | 12/2001 | Kohyama |
| 6,331,461 | B1 | 12/2001 | Juengling |
| 6,372,554 | B1 | 4/2002 | Kawakita et al. |
| 6,383,861 | B1 | 5/2002 | Gonzalez et al. |
| 6,399,490 | B1 | 6/2002 | Jammy et al. |
| 6,403,442 | B1 | 6/2002 | Reinberg |
| 6,432,472 | B1 | 8/2002 | Farrell et al. |
| 6,458,653 | B1 | 10/2002 | Jang |
| 6,458,925 | B1 | 10/2002 | Fasano |
| 6,459,138 | B2 | 10/2002 | Reinberg |
| 6,482,749 | B1 | 11/2002 | Billington et al. |
| 6,617,222 | B1 | 9/2003 | Coursey |
| 6,620,724 | B1 | 9/2003 | Schroeder et al. |
| 6,645,869 | B1 | 11/2003 | Chu et al. |
| 6,656,748 | B2 | 12/2003 | Hall et al. |
| 6,667,502 | B1 | 12/2003 | Agarwal et al. |
| 6,673,693 | B2 | 1/2004 | Kirchhoff |
| 6,703,273 | B2 | 3/2004 | Wang et al. |
| 6,707,088 | B2 | 3/2004 | Fishburn |
| 6,709,978 | B2 | 3/2004 | Geusic et al. |
| 6,720,232 | B1 | 4/2004 | Tu et al. |
| 6,767,789 | B1 | 7/2004 | Bronner et al. |
| 6,784,112 | B2 | 8/2004 | Arita et al. |
| 6,784,479 | B2 | 8/2004 | Park |
| 6,787,833 | B1 | 9/2004 | Fishburn |
| 6,812,513 | B2 | 11/2004 | Geusic et al. |
| 6,822,261 | B2 | 11/2004 | Yamazaki et al. |
| 6,822,280 | B2 | 11/2004 | Ito et al. |
| 6,844,230 | B2 | 1/2005 | Reinberg |
| 6,849,496 | B2 | 2/2005 | Jaiprakash et al. |
| 6,853,023 | B2 | 2/2005 | Goebel |
| 6,893,914 | B2 | 5/2005 | Kim et al. |
| 6,897,109 | B2 | 5/2005 | Jin et al. |
| 6,927,122 | B2 | 8/2005 | Geusic et al. |
| 6,927,170 | B2 | 8/2005 | Zheng |
| 6,930,640 | B2 | 8/2005 | Chung et al. |
| 6,936,880 | B2 | 8/2005 | Park |
| 6,939,794 | B2 | 9/2005 | Yin et al. |
| 6,962,846 | B2 | 11/2005 | Fishburn et al. |
| 6,991,980 | B2 | 1/2006 | Park |
| 7,005,379 | B2 | 2/2006 | Sinha et al. |
| 7,042,040 | B2 | 5/2006 | Horiguchi |
| 7,053,435 | B2 | 5/2006 | Yeo et al. |
| 7,053,453 | B2 | 5/2006 | Tsao et al. |
| 7,064,028 | B2 | 6/2006 | Ito et al. |
| 7,064,365 | B2 | 6/2006 | An et al. |
| 7,067,385 | B2 | 6/2006 | Manning |
| 7,071,055 | B2 | 7/2006 | Fishburn |
| 7,073,969 | B2 | 7/2006 | Kamm |
| 7,074,669 | B2 | 7/2006 | Iijima et al. |
| 7,081,384 | B2 | 7/2006 | Birner et al. |
| 7,084,451 | B2 | 8/2006 | Forbes et al. |
| 7,094,701 | B2 | 8/2006 | Mitsuo et al. |
| 7,115,500 | B1 | 10/2006 | Torres |
| 7,115,531 | B2 | 10/2006 | Shaffer et al. |
| 7,125,781 | B2 | 10/2006 | Manning et al. |
| 7,153,778 | B2 | 12/2006 | Busch et al. |
| 7,160,788 | B2 | 1/2007 | Sandhu et al. |
| 7,179,706 | B2 | 2/2007 | Patraw et al. |
| 7,199,005 | B2 | 4/2007 | Sandhu et al. |
| 7,202,127 | B2 | 4/2007 | Busch et al. |
| 7,223,690 | B2 | 5/2007 | Kondo et al. |
| 7,226,845 | B2 * | 6/2007 | Manning et al. ............ 438/386 |
| 7,235,479 | B2 | 6/2007 | Verhaverbeke |
| 7,235,485 | B2 | 6/2007 | Kwak et al. |
| 7,268,039 | B2 | 9/2007 | Fishburn et al. |
| 7,271,051 | B2 | 9/2007 | Manning et al. |
| 7,321,149 | B2 | 1/2008 | Busch et al. |
| 7,321,150 | B2 | 1/2008 | Fishburn et al. |
| 7,335,935 | B2 | 2/2008 | Sinha et al. |
| 7,341,909 | B2 | 3/2008 | McDaniel et al. |
| 7,384,847 | B2 | 6/2008 | Tran et al. |
| 7,387,939 | B2 | 6/2008 | Manning |
| 7,393,741 | B2 | 7/2008 | Sandhu et al. |
| 7,393,743 | B2 | 7/2008 | Manning |
| 7,413,952 | B2 | 8/2008 | Busch et al. |
| 7,420,238 | B2 | 9/2008 | Manning et al. |
| 7,439,152 | B2 | 10/2008 | Manning |
| 7,440,255 | B2 | 10/2008 | McClure et al. |
| 7,442,600 | B2 | 10/2008 | Wang et al. |
| 7,445,990 | B2 | 11/2008 | Busch et al. |
| 7,445,991 | B2 | 11/2008 | Manning |
| 7,449,391 | B2 | 11/2008 | Manning et al. |
| 7,459,362 | B2 | 12/2008 | Juengling |
| 7,474,215 | B2 | 1/2009 | Scott et al. |
| 7,517,754 | B2 | 4/2009 | McDaniel et al. |
| 7,534,694 | B2 | 5/2009 | Manning |
| 7,538,036 | B2 | 5/2009 | Busch et al. |
| 7,544,563 | B2 | 6/2009 | Manning et al. |
| 7,557,013 | B2 | 7/2009 | Bhat et al. |
| 7,557,015 | B2 | 7/2009 | Sandhu et al. |
| 7,573,088 | B2 | 8/2009 | Juengling |
| 7,576,441 | B2 | 8/2009 | Yin et al. |
| 7,638,392 | B2 | 12/2009 | Wang et al. |
| 7,655,968 | B2 | 2/2010 | Manning |
| 7,682,924 | B2 | 3/2010 | Bhat et al. |
| 7,759,193 | B2 | 7/2010 | Fishburn |
| 7,785,962 | B2 | 8/2010 | Bhat et al. |
| 7,807,580 | B2 | 10/2010 | Lee et al. |
| 7,902,081 | B2 | 3/2011 | Raghu et al. |
| 2001/0012223 | A1 | 8/2001 | Kohyama |
| 2001/0026974 | A1 | 10/2001 | Reinberg |
| 2001/0038111 | A1 | 11/2001 | DeBoer et al. |
| 2001/0044181 | A1 | 11/2001 | Nakamura |
| 2002/0022339 | A1 | 2/2002 | Kirchhoff |
| 2002/0030221 | A1 | 3/2002 | Sandhu et al. |
| 2002/0039826 | A1 | 4/2002 | Reinberg |
| 2002/0086479 | A1 | 7/2002 | Reinberg |
| 2002/0090779 | A1 | 7/2002 | Jang |
| 2002/0098654 | A1 | 7/2002 | Durcan et al. |
| 2002/0153589 | A1 | 10/2002 | Oh |
| 2002/0153614 | A1 | 10/2002 | Ema et al. |
| 2002/0163026 | A1 | 11/2002 | Park |
| 2003/0085420 | A1 | 5/2003 | Ito et al. |
| 2003/0087501 | A1 | 5/2003 | Park |
| 2003/0134468 | A1 | 7/2003 | Wang et al. |
| 2003/0153146 | A1 | 8/2003 | Won et al. |
| 2003/0169629 | A1 | 9/2003 | Geobel et al. |
| 2003/0178684 | A1 | 9/2003 | Nakamura |
| 2003/0190782 | A1 | 10/2003 | Ko et al. |
| 2003/0227044 | A1 | 12/2003 | Park |

| | | | |
|---|---|---|---|
| 2004/0018679 A1 | 1/2004 | Yu et al. | |
| 2004/0056295 A1 | 3/2004 | Agarwal et al. | |
| 2004/0110340 A1 | 6/2004 | Kim et al. | |
| 2004/0150070 A1 | 8/2004 | Okada et al. | |
| 2004/0188738 A1 | 9/2004 | Farnworth et al. | |
| 2005/0023588 A1* | 2/2005 | Sandhu et al. | 257/309 |
| 2005/0051822 A1 | 3/2005 | Manning | |
| 2005/0054159 A1* | 3/2005 | Manning et al. | 438/253 |
| 2005/0158949 A1 | 7/2005 | Manning | |
| 2005/0176210 A1 | 8/2005 | Kim et al. | |
| 2005/0287738 A1 | 12/2005 | Cho et al. | |
| 2005/0287780 A1 | 12/2005 | Manning et al. | |
| 2005/0287795 A1 | 12/2005 | Torek et al. | |
| 2006/0006502 A1 | 1/2006 | Yin et al. | |
| 2006/0014344 A1 | 1/2006 | Manning | |
| 2006/0024958 A1 | 2/2006 | Ali | |
| 2006/0024966 A1 | 2/2006 | Mitsuo et al. | |
| 2006/0046420 A1 | 3/2006 | Manning | |
| 2006/0051918 A1* | 3/2006 | Busch et al. | 438/253 |
| 2006/0063344 A1 | 3/2006 | Manning et al. | |
| 2006/0063345 A1 | 3/2006 | Manning et al. | |
| 2006/0115951 A1 | 6/2006 | Mosley | |
| 2006/0115952 A1 | 6/2006 | Wu | |
| 2006/0121672 A1 | 6/2006 | Basceri et al. | |
| 2006/0148190 A1 | 7/2006 | Busch | |
| 2006/0186451 A1 | 8/2006 | Dusberg et al. | |
| 2006/0211196 A1 | 9/2006 | Tanaka et al. | |
| 2006/0211211 A1 | 9/2006 | Sandhu et al. | |
| 2006/0237762 A1 | 10/2006 | Park | |
| 2006/0249798 A1 | 11/2006 | Manning | |
| 2006/0261440 A1 | 11/2006 | Manning | |
| 2006/0263968 A1 | 11/2006 | Manning | |
| 2006/0286783 A1 | 12/2006 | Papanu et al. | |
| 2006/0289914 A1 | 12/2006 | Juengling | |
| 2007/0032014 A1 | 2/2007 | Sandhu et al. | |
| 2007/0045699 A1 | 3/2007 | Liao et al. | |
| 2007/0045799 A1 | 3/2007 | Liao et al. | |
| 2007/0048976 A1 | 3/2007 | Raghu | |
| 2007/0057304 A1 | 3/2007 | Boescke et al. | |
| 2007/0093022 A1 | 4/2007 | Basceri | |
| 2007/0099328 A1 | 5/2007 | Chiang et al. | |
| 2007/0145009 A1 | 6/2007 | Fucskco et al. | |
| 2007/0181929 A1 | 8/2007 | Juengling | |
| 2007/0196978 A1 | 8/2007 | Manning | |
| 2007/0202686 A1 | 8/2007 | Dixit et al. | |
| 2007/0207622 A1 | 9/2007 | Rana et al. | |
| 2007/0238259 A1* | 10/2007 | Bhat et al. | 438/381 |
| 2007/0257323 A1 | 11/2007 | Tsui et al. | |
| 2008/0090416 A1 | 4/2008 | Raghu et al. | |
| 2008/0171137 A1 | 7/2008 | Kim et al. | |
| 2008/0174430 A1 | 7/2008 | Scott et al. | |
| 2009/0047769 A1 | 2/2009 | Bhat et al. | |
| 2009/0176011 A1 | 7/2009 | Kiehlbauch | |
| 2009/0251845 A1 | 10/2009 | Kiehlbauch | |
| 2010/0009512 A1 | 1/2010 | Fishburn | |
| 2010/0041204 A1 | 2/2010 | Kiehlbauch | |
| 2010/0112798 A1 | 5/2010 | Lai et al. | |
| 2011/0151655 A1 | 6/2011 | Chan et al. | |
| 2011/0183522 A1 | 7/2011 | Mikhaylichenko et al. | |
| 2011/0227167 A1 | 9/2011 | Chuang et al. | |

FOREIGN PATENT DOCUMENTS

| | | |
|---|---|---|
| JP | 08-274278 | 10/1996 |
| JP | 10-189912 | 7/1998 |
| JP | 11-026719 | 1/1999 |
| JP | 11-191615 | 7/1999 |
| JP | 2000-196038 | 7/2000 |
| JP | 2001-189438 | 7/2001 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004072078 | 3/2004 |
| JP | 2004-111626 | 4/2004 |
| JP | 2004-128463 | 4/2004 |
| JP | 2005032982 | 2/2005 |
| JP | 2006-032695 | 2/2006 |
| JP | 2006-135364 | 5/2006 |
| KR | 20010061020 | 7/2001 |
| KR | 10-2001-108963 | 12/2001 |
| KR | 20010114003 | 12/2001 |
| KR | 1020030058018 | 7/2003 |
| KR | 1020050000896 | 1/2005 |
| KR | 10-520223 | 10/2005 |
| TW | 513801 | 12/2002 |
| TW | I252511 | 4/2006 |
| TW | I307160 | 3/2009 |
| TW | 098121062 | 8/2012 |
| WO | 2005/062349 | 7/2005 |
| WO | PCT/US2009/046946 | 1/2010 |
| WO | PCT/US20009/046946 | 1/2011 |

OTHER PUBLICATIONS

PCT/US2004/0027898; Filed Aug. 26, 2004; Search Report mailed Jul. 24, 2008.

PCT/US2004/0027898; Filed Aug. 26, 2004; Written Opinion mailed Jul. 24, 2008.

PCT/US2004/0040252; Filed Dec. 1, 2004; Search Report mailed May 25, 2005.

PCT/US2004/0040252; Filed Dec. 1, 2004; Written Opinion mailed May 25, 2005.

WO 2005/024936; Filed Jul. 15, 2005; Search Report mailed Jun. 15, 2006.

WO 2005/024936; Filed Jul. 15, 2005; Written Opinion mailed Jun. 15, 2006.

PCT/US2006/06806; Filed Feb. 27, 2006; IPER mailed Mar. 30, 2007.

PCT/US2006/06806; Filed Feb. 27, 2006; Search Report mailed Sep. 28, 2006.

PCT/US2006/06806; Filed Feb. 27, 2006; Written Opinion mailed Sep. 28, 2006.

PCT/US2006/06806; Filed Feb. 27, 2006; Response to Written Opinion filed Sep. 18, 2007.

PCT/US2008/070071; Filed May 31, 2007; Search Report mailed Nov. 29, 2007.

PCT/US2008/070071; Filed May 31, 2007; Written Opinion mailed Nov. 29, 2007.

PCT/US2008/070071; Filed May 31, 2007; IPRP mailed Feb. 16, 2010.

Gibson et al., Cellular Solids, MRS BULLETIN, pp. 270-274 (Apr. 2003).

Green et al., Cellular Ceramics: Intriguing Structures, Novel Properties, and Innovative Applications, MRSBULLETIN, pp. 296-300 (Apr. 2003).

Green et al., The Structure and Applications of Cellular Ceramics, WEB EXTRA, 10 pages (Apr. 2003).

Karp et al., Scaffolds for Tissue Engineering, MRS Bulletin, pp. 301-306 (Apr. 2003).

Kraynik, Foam Structure: From Soap Froth to Solid Foams, MRS BULLETIN, pp. 275-276 (Apr. 2003).

Maire et al., In Situ X-Ray Tomography Measurements of Deformation in Cellular Solids, MRS BULLETIN, pp. 284-289 (Apr. 2003).

Oh et al., Preparation and Pore-Characteristics Control of Nano-Porous Materials Using Organometallic Building Blocks, 4 CARBON SCIENCE, No. 1, pp. 1-9 (Mar. 2003).

Onck, Scale Effects in Cellular Metals, MRS BULLETIN, pp. 279-283 (Apr. 2003).

Park et al., Block Copolymer Lithography: Periodic Arrays of 1011 Holes in 1 Square Centimeter, 276 Science, pp. 1401-1404 (May 30, 1997).

Tsukada et al., Preparation and Application of Porous Silk Fibroin Materials, 54 JOURNAL OF APPLIED POLYMER SCIENCE, pp. 507-514 (1994).

Li, X and Bohn, P.W.; "Metal-assisted chemical etching in HF/H2O2 produces porous silicon" American Institute of Physics, vol. 77, No. 16, Oct. 16, 2000.

"Novel Robust Cell Capacitor (Leaning Exterminated Ring Type Insulator) and New Storage Node Contact for 70nm DRAM Technology and Beyond"; Park et al.; Jul. 2004; pp. 34-35.

J. P. O'Sullivan et al., The morphology and mechanism of formation of porous anodic films on aluminum, PROC. ROY. SOC. LOND. A, vol. 317, pp. 511-543 (1970).

S. Shingubara, Fabrication of nanomaterials using porous alumina templates, J. NANOPARTICLES RES., vol. 5, pp. 17-30 (2003).

S. Tan et al., High Aspect Ratio Microstructures on Porous Anodic Aluminum Oxide, IEEE, pp. 267-272 (1995).

J. Liang et al., Nonlithographic Fabrication of Lateral Superlattices for Nanometric Electromagnetic-Optic . . . , vol. 8, No. 5, pp. 998-1008; (Sep./Oct. 2002).

H. Masuda et al., Highly ordered nanochannel-array architecture in anodic alumina, App. Phys. Lett, vol. 71,No. 19, pp. 2770-2772 (Nov. 1997).

D. Crouse et al., Self-Assembled Nanostructures Using Anodized Alumina Thin Films for Optoelectronic Applications, IEEE, pp. 234-235 (1999).

A. Nadeem et al., Fabrication of Microstructures Using Aluminum Anodization Techniques, pp. 274-277; (pre-2004).

C. Y. Liu et al., Ordered anodic alumina nanochannels on focused-ion-beam-prepatterned aluminum surfaces, Appl. Phys. Lett., vol. 78, No. 1, pp. 120-122 (Jan. 2001).

Kim,D.H. et al., "A Mechanically Enhanced Storage Node for Virtually Unlimited Height (MESH) Capacitor Aiming at Sub 70nnn DRAMs", IEEE, IEDM Jan. 2004, pp. 3.4.1-3.4.4.

Yasaitis et al. "A Modular Process for Integrating Thick Polysilicon MEMS Devices with Sub-micron CMOS" www. eecs.berkeley.edu/-boxer/publications/yasaitis03.pdg; pre-2004.

V. V. Konovalov et al., Chemistry of Materials, CHEM. MATER., vol. 11, No. 8, pp. 1949-1951 (Aug. 1999).

Banhart, Aluminum Foams: On the Road to Real Applications, MRS BULLETIN, pp. 290-295 (Apr. 2003).

US-PCT/US09/046946, Jan. 20, 2011, IPRP.

21 Website, "http://en.wikipedia.org/w/index.php?title=Conductive_polymer&printable=yes".

J Robertson, Diamond-like amorphous carbon, Material Science and Engineering R 37 (2002) 129-281.

John Robertson, Hard Amorphous (Diamond-Like) Carbons, Prog Solid St Chem. vol. 21, pp. 199-333, (1991).

* cited by examiner

METHODS OF FORMING A PLURALITY OF CAPACITORS

RELATED PATENT DATA

This patent resulted from a continuation application of U.S. patent application Ser. No. 11/838,070, filed Aug. 13, 2007, entitled "Methods of Forming a Plurality of Capacitors", naming Vishwanath Bhat, Kevin R. Shea and Farrell Good as inventors, the disclosure of which is incorporated by reference.

TECHNICAL FIELD

This invention relates to methods of forming a plurality of capacitors.

BACKGROUND OF THE INVENTION

Capacitors are one type of component commonly used in the fabrication of integrated circuits, for example in DRAM circuitry. A capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors may be fabricated in such insulative capacitor electrode-forming material, with an example insulative electrode-forming material being silicon dioxide doped with one or both of phosphorus and boron. The capacitor electrode openings may be formed by etching. It can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area and thereby increased capacitance for the capacitors being formed. However, the capacitor electrodes formed in deep openings are often correspondingly much taller than they are wide. This can lead to toppling of the capacitor electrodes, either during the etch to expose the outer sidewalls surfaces, during transport of the substrate, and/or during deposition of the capacitor dielectric layer or outer capacitor electrode layer. Our U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Published Application No. 2005/0051822;
U.S. Published Application No. 2005/0054159;
U.S. Published Application No. 2005/0158949;
U.S. Published Application No. 2005/0287780;
U.S. Published Application No. 2006/0014344;
U.S. Published Application No. 2006/0051918;
U.S. Published Application No. 2006/0046420;
U.S. Published Application No. 2006/0121672;
U.S. Published Application No. 2006/0211211;
U.S. Published Application No. 2006/0263968;
U.S. Published Application No. 2006/0261440;
U.S. Published Application No. 2007/0032014;
U.S. Published Application No. 2006/0063344;
U.S. Published Application No. 2006/0063345;

Fabrication of capacitors in memory circuitry may form an array of capacitors within a capacitor array area. Control or other circuitry area is often displaced from the capacitor array area, with the substrate including an intervening area between the capacitor array area and the control or other circuitry area. In some instances, a trench is formed in the intervening area between the capacitor array area and the other circuitry area. Such trench can be formed commensurate with the fabrication of the openings within the capacitor array area within which the isolated capacitor electrodes will be received.

When etching the insulative electrode-forming material within which the capacitor electrodes are received to expose outer sidewall surfaces thereof, it is often desired that none of the insulative material within the other circuitry area be etched. One prior art method restricts such by masking the peripheral circuitry area. Specifically, a silicon nitride layer may be formed over the predominantly insulative material within which the capacitor electrodes are formed. The conductive material deposited to form the capacitor electrodes within the electrode openings also deposits and lines the trench between the capacitor array area and the peripheral circuitry area. One example conductive material is titanium nitride. The titanium nitride is polished back at least to the silicon nitride layer, thereby forming isolated container-shaped structures within individual capacitor electrode openings in the array area and within the trench. Accordingly, the sidewalls and bottom of the trench are covered or masked with titanium nitride, whereas the top or elevationally outermost surface of the peripheral or other circuitry area is covered with silicon nitride.

Etch access openings are then formed at spaced intervals within the silicon nitride within the capacitor array area to expose the insulative capacitor electrode-forming material therebeneath. Elevationally outermost surfaces of the peripheral circuitry area are typically kept entirely masked with the silicon nitride layer. When the insulative capacitor electrode-forming material comprises phosphorus and/or boron doped silicon dioxide, one example aqueous etching chemistry utilized to etch such highly selectively to titanium nitride and to silicon nitride is an aqueous HF solution. Such desirably results in exposure of the outer sidewalls of the individual capacitor electrodes while the peripheral insulative material remains masked from such etching by the overlying silicon nitride layer and from the titanium nitride within the peripheral trench.

Titanium nitride from which the capacitor electrodes are formed and which masks the sidewalls of the peripheral trench might be deposited in a manner which produces cracks or pinholes that extend laterally therethrough. This is not particularly problematic within the capacitor array area as it is desired that the insulative material be removed from both the inner and outer lateral sidewalls of the capacitor electrodes. Passage of liquid etchant through any cracks or pinholes within the array area does not defeat this purpose. However, cracks or pinholes in the titanium nitride layer protecting the lateral sidewalls of the peripheral circuitry insulative material can be problematic. Specifically, etchant seeping therethrough can cause etching voids or pockets to form laterally within the peripheral circuitry insulative material. These can later create fatal contact-to-contact shorts in the peripheral circuitry area when conductive vertical contacts are formed therein.

One existing solution to such problem is to deposit a very thin polysilicon layer to line internal portions of the capacitor electrodes and against the titanium nitride layer which laterally covers the insulative material of the peripheral circuitry area. Polysilicon is highly resistant to etch by HF. Such will shield any pinholes, thereby precluding HF or other etchants from seeping therethrough and undesirably etching the peripheral circuitry area insulative material.

Polysilicon is usually undesired subsequently, and is therefore removed. Accordingly, after etching back the insulative material to expose the outer sidewalls of the capacitor electrodes, a dedicated wet etch is conducted to highly selectively remove the polysilicon relative to undoped silicon dioxide, the titanium nitride, and the silicon nitride. Prior to this, a separate dedicated wet etch is conducted to remove an undesired native oxide which forms over the polysilicon.

Regardless of whether pinholes or cracks are formed in the capacitor electrode material, the material is often received against the silicon nitride, or other material, received over the insulative electrode-forming material. Such creates an interface or seam through which liquid etchant can seep which may undesirably cause etching of the insulative electrode-forming material in the periphery.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Example embodiments of the invention are described below with reference to the following accompanying drawings.

FIG. 6A is an enlargement of a portion of FIG. 6.

FIG. 12 is a view of the FIG. 10 substrate at a processing step subsequent to that shown by FIG. 10.

DETAILED DESCRIPTION OF EXAMPLE EMBODIMENTS

This disclosure of the invention is submitted in furtherance of the constitutional purposes of the U.S. Patent Laws "to promote the progress of science and useful arts" (Article 1, Section 8).

Figure 1:
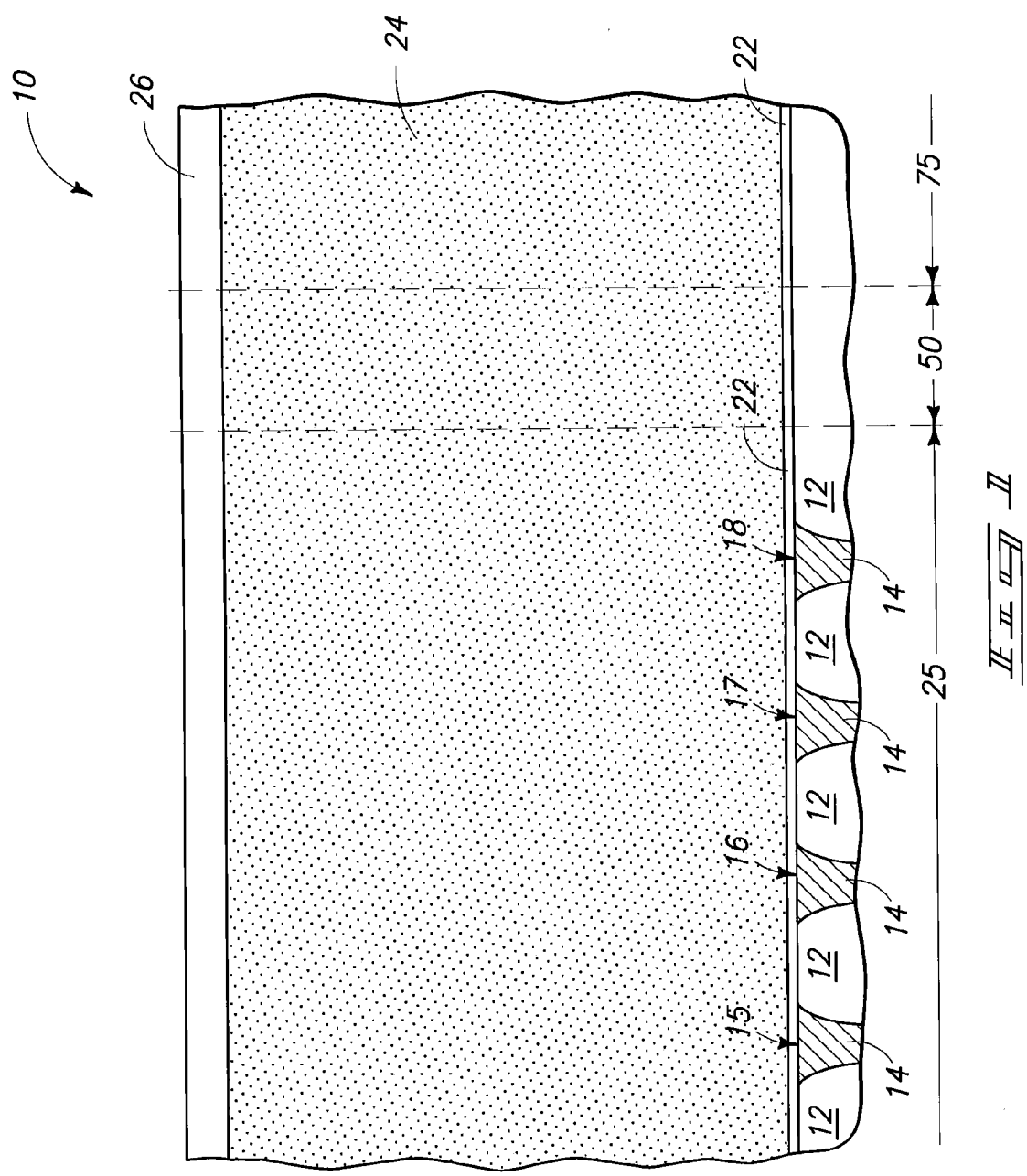
FIG. 1 is a diagrammatic cross section of a substrate fragment in process in accordance with an aspect of the invention.
Figure 2:
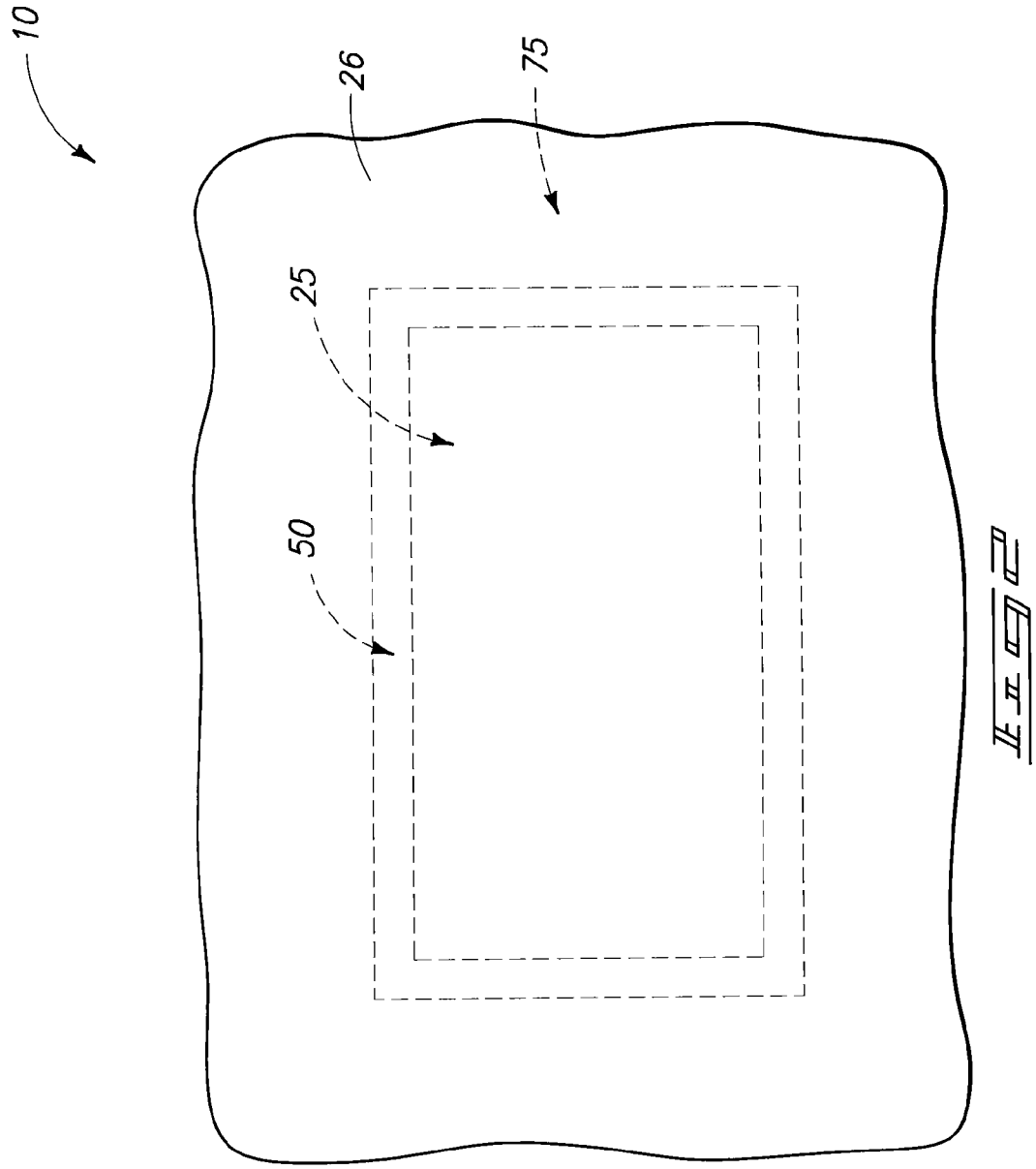
FIG. 2 is a diagrammatic top plan view of a larger scale portion of the FIG. 1 substrate.

Example methods of forming pluralities of capacitors are described with reference to FIGS. 1-13. Referring initially to FIGS. 1 and 2, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, FIG. 1 might comprise a bulk semiconductor material (not shown), for example bulk monocrystalline, and/or comprise semiconductor-on-insulator layers.

Substrate 10 can be considered as comprising a capacitor array area 25, a circuitry area 75 other than capacitor array area 25, and an intervening area 50 between capacitor array area 25 and circuitry area 75. In the depicted example embodiment, intervening area 50 completely surrounds and encircles capacitor array area 25 (FIG. 2), and circuitry area 75 comprises a peripheral circuitry area to that of capacitor array area 25. Alternate constructions are contemplated, of course, for example whereby neither intervening area 50 nor circuitry area 75 completely or partially encircles a capacitor array area 25.

FIG. 1 depicts an insulative material 12 having electrically conductive storage node pillars 14 formed therethrough. Materials 12 and 14 may be fabricated over some suitable underlying material, for example bulk monocrystalline and/or underlying circuitry. Example insulative materials 12 include doped and undoped silicon dioxides, for example silicon dioxide deposited by the decomposition of tetraethylorthosilicate (TEOS) and/or borophosphosilicate glass (BPSG) and/or silicon nitride. Alternately by way of example only, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations 15, 16, 17 and 18 on substrate 10. Storage node locations 15, 16, 17 and 18 are examples only, and regardless, may be conductive at this point in the process, or made conductive subsequently.

An example layer 22 has been formed over material 12 and capacitor storage node locations 15, 16, 17 and 18. Examples for layer 22 comprise silicon nitride and/or undoped silicon dioxide deposited to an example thickness range of from about 100 Angstroms to about 2,000 Angstroms. Layer 22 might be included to provide an etch stop, or other function.

Some insulative material 24 is received over capacitor array area 25 and circuitry area 75, and also in the depicted embodiment over intervening area 50. Such might be homogeneous or comprise multiple different compositions and/or layers. An example material is doped silicon dioxide comprising at least one of phosphorus and boron, for example BPSG, borosilicate glass (BSG), and/or phosphosilicate glass (PSG). An example thickness range for material 24 is from 5,000 Angstroms to 10 microns, with 2 microns being a specific example. Thinner and greater thicknesses are, of course, contemplated.

In one embodiment, a masking layer 26 (in one embodiment an insulator layer other than doped silicon dioxide) is received over insulative material 24. In some embodiments, such comprises, consists essentially of, or consists of silicon nitride. An example thickness range is from 200 Angstroms to 5,000 Angstroms. Some or all of layer 26 might be removed, or some or all of layer 26 might remain over the substrate as part of finished circuitry construction incorporating a plurality of capacitors being fabricated. Material other than silicon nitride might also be utilized, and not all embodiments of the invention necessarily require a masking layer 26.

Figure 3:
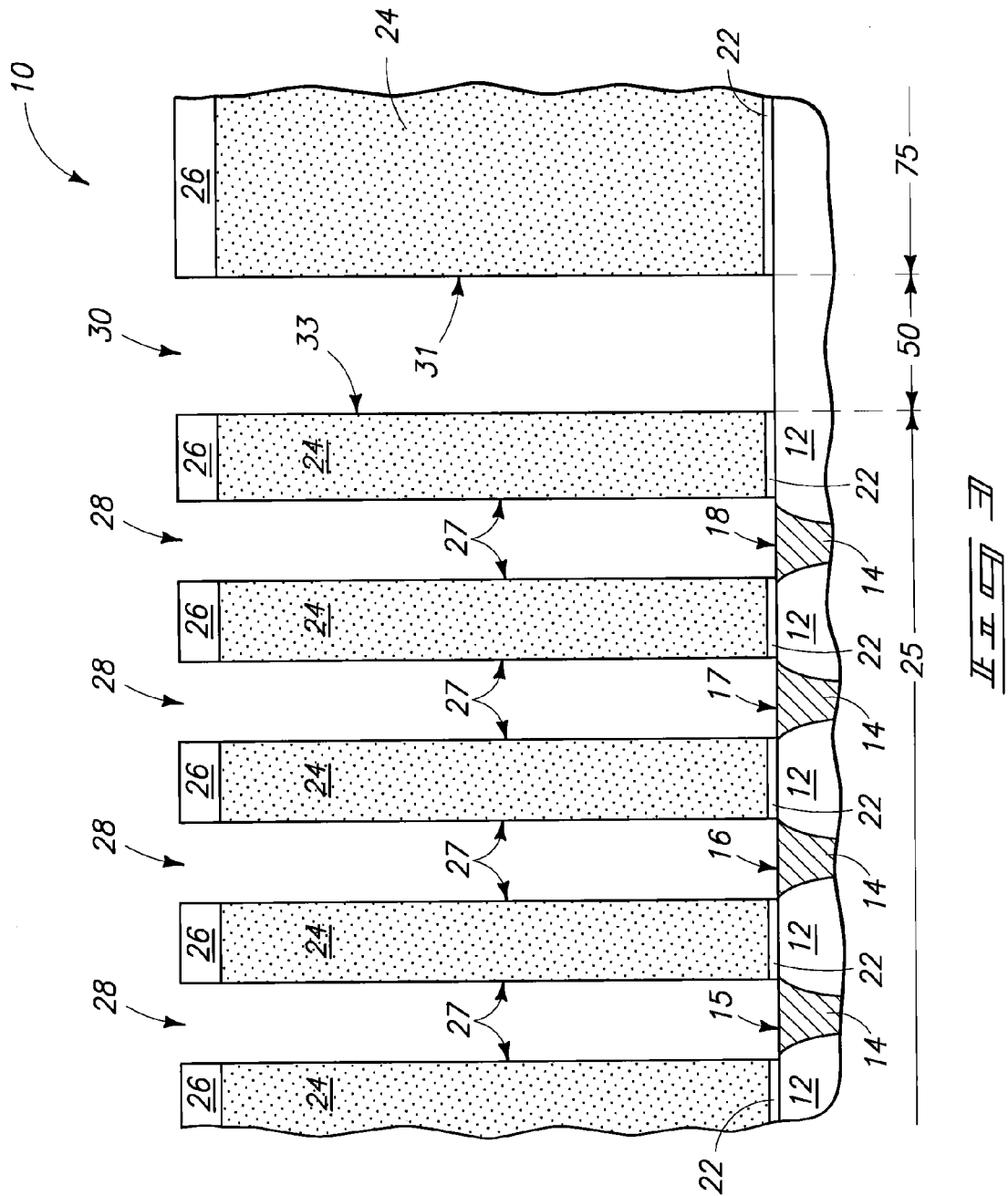
FIG. 3 is a view of the FIG. 1 substrate at a processing step subsequent to that shown by FIG. 1, and taken through line 3-3 in FIG. 4.
Figure 4:
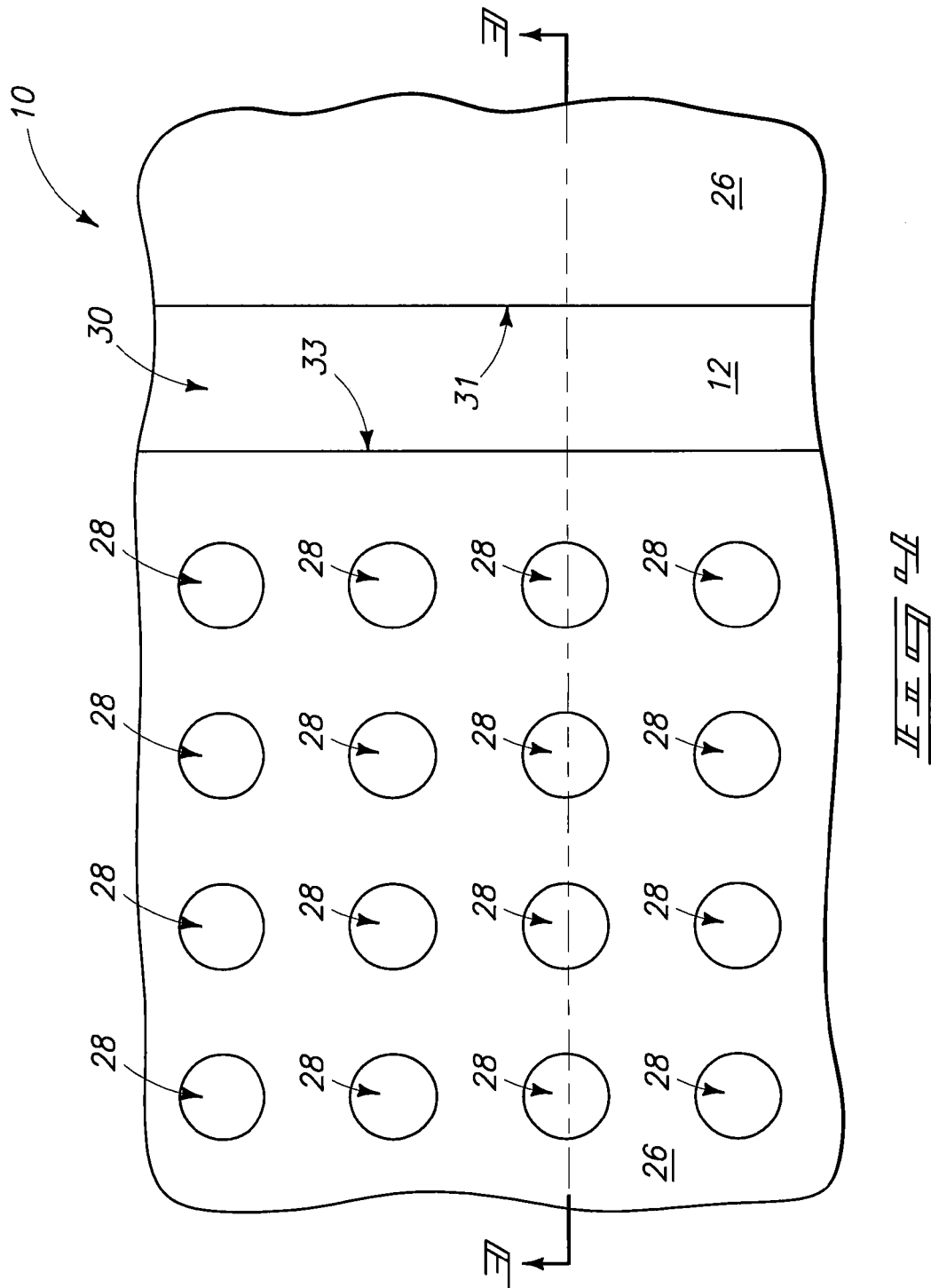
FIG. 4 is a diagrammatic top plan view of the FIG. 3 substrate fragment.

Referring to FIGS. 3 and 4, a plurality of capacitor electrode openings 28 has been formed within insulator layer 26, insulative material 24, and layer 22 over individual capacitor storage node locations 15, 16, 17 and 18. Further, a trench 30 has been formed in intervening area 50 within materials 26, 24 and 22. In one example embodiment, trench 30 completely surrounds capacitor area 25. An example technique for forming capacitor electrode openings 28 and trench 30 comprises photolithographic patterning and selective anisotropic dry etching to produce the example FIGS. 3 and 4 constructions. An example minimum width of trench opening 30 is from about 200 Angstroms to about 5,000 Angstroms, while an example minimum width for capacitor electrode openings 28 is from about 200 Angstroms to about 5,000 Angstroms. Trench 30 can be considered as comprising sidewall portions 31 and 33, and capacitor electrode openings 28 can be considered as having sidewall portions 27.

Figure 5:
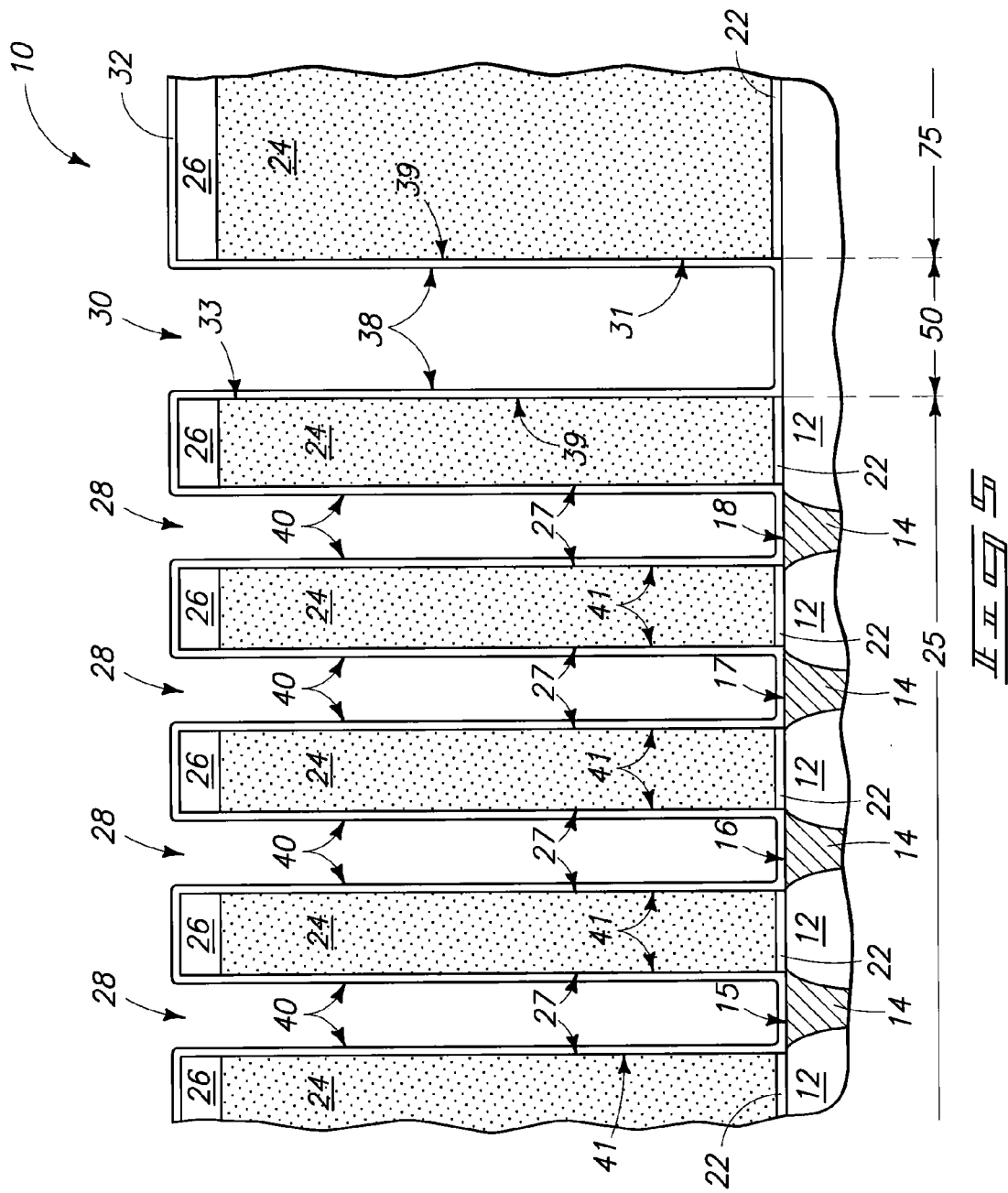
FIG. 5 is a view of the FIG. 3 substrate at a processing step subsequent to that shown by FIG. 3.

Referring to FIG. 5, conductive material 32 has been formed within, capacitor electrode openings 28, and within trench 30 to line capacitor electrode openings 28 and trench 30 to less than completely fill trench 30. In the depicted example embodiment, conductive material 32 also less than fills capacitor electrode openings 28, and lines sidewalls portions 27 of capacitor electrode openings 28. Conductive material 32 can be considered as having inner sidewalls 40 and outer sidewalls 41 within capacitor electrode openings 28 within capacitor array area 25, and inner sidewalls 38 and outer sidewalls 39 within trench 30. An example conductive material 32 comprises titanium nitride deposited to an example thickness from about 20 Angstroms to about 1,000 Angstroms, with another example thickness being from about 200 Angstroms to about 300 Angstroms. Alternately, conductive material 32 might fill capacitor electrode openings 28. By way of example only where conductive material 32 comprises TiN, one manner of depositing such is by thermal chemical vapor deposition, for example at a substrate temperature of from about 450° C. to about 680° C., a chamber pressure of from about 0.5 Torr to about 1.5 Torr, and using precursors comprising $TiCl_4$ and $NH_3$. Regardless, openings, cracks, and/or pinholes (not shown) may or may not be formed through some or all of the thickness of conductive material 32.

Figure 6:
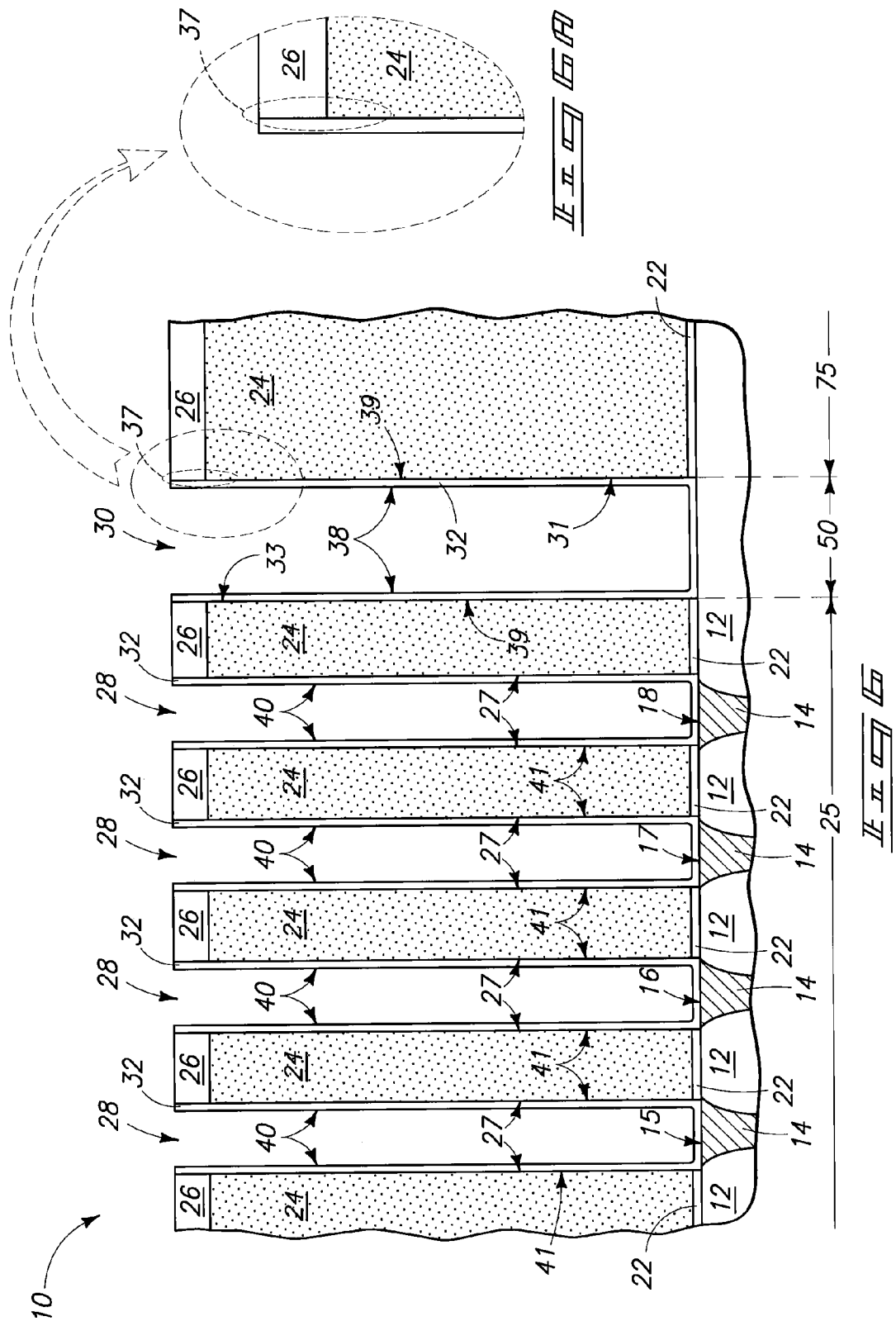
FIG. 6 is a view of the FIG. 5 substrate at a processing step subsequent to that shown by FIG. 5.

Referring to FIGS. 6 and 6A, conductive layer 32 has been planarized back at least to an outer surface of insulator layer 26, thereby forming isolated/separate capacitor electrodes within capacitor electrode openings 28 and an isolation structure within trench 30. For purposes of the continuing discussion, conductive material 32 within trench 30 and insulative material 24 (which in the depicted embodiment also includes layer 26 thereover) can be considered as comprising an elevationally outer interface 37 therebetween.

Figure 7:
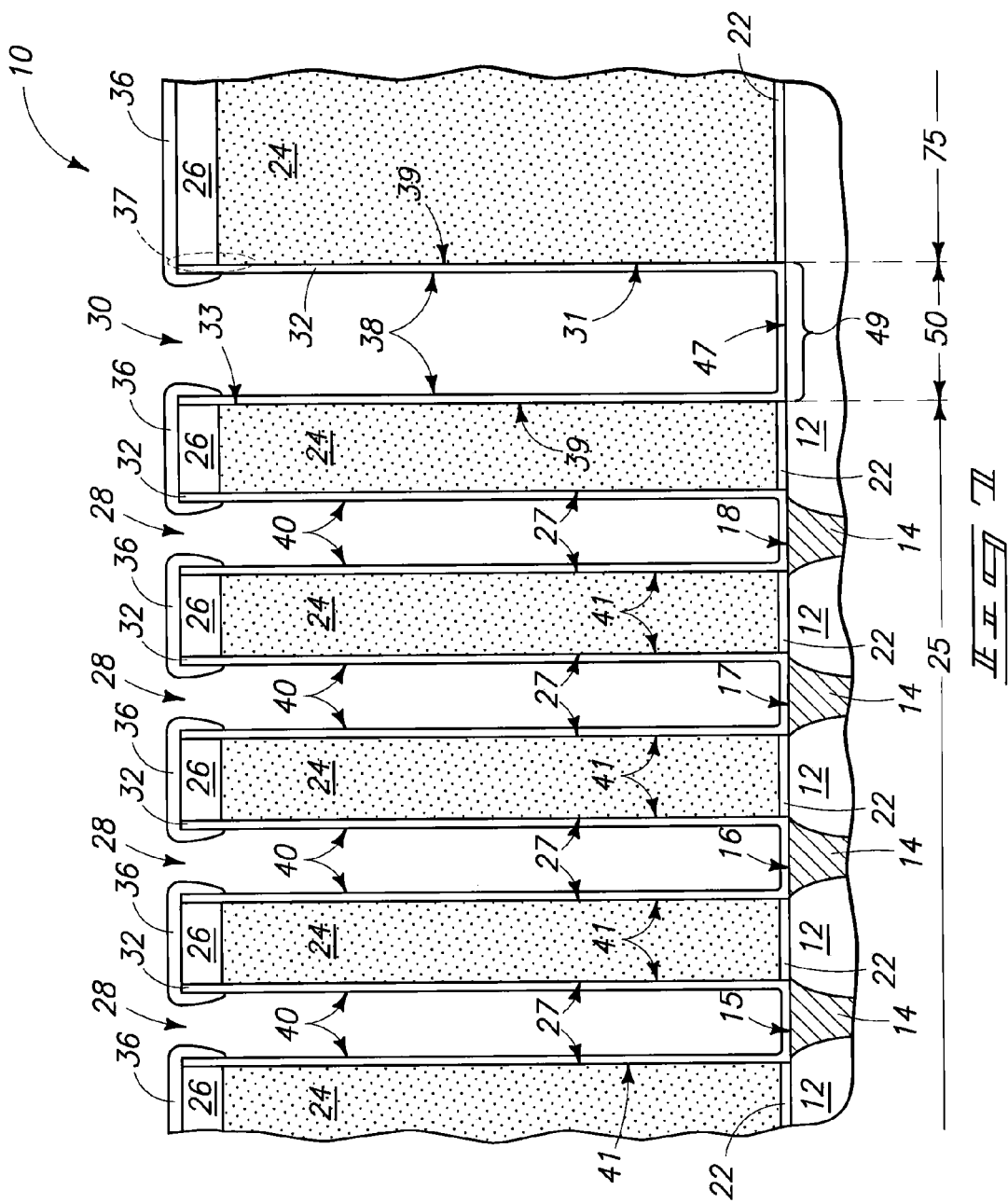
FIG. 7 is a view of the FIG. 6 substrate at a processing step subsequent to that shown by FIG. 6.

Referring to FIG. 7, covering material 36 has been formed over insulator layer 26 and atop interface 37 and laterally over an upper portion of inner sidewalls 38 of conductive material 32 within trench 30. In the depicted example embodiment, covering material 36 is also formed laterally over an upper portion of inner sidewalls 40 within capacitor electrode openings 28 within capacitor array area 25. In one embodiment, the upper portion of inner sidewalls 38 over which covering material 36 is formed is no greater than 20%, and in another embodiment no greater than 10%, of depth of trench 30 within insulative material 24, and/or 24/26/22 where layers 22 and 26 are present and are insulative. An example thickness range for layer 36 is from about 50 Angstroms to about 100 Angstroms over interface 37. Also in the depicted embodiment, covering material 36 does not laterally cover an entirety of inner sidewalls 38 of conductive material 32 within trench 30, and in one embodiment is deposited to be nonconformal over the upper portion of inner sidewalls 38 of conductive material 32 to have at least two different lateral thicknesses therealong. Regardless, in one embodiment, covering material 36 may or may not be formed onto a base portion of conductive material 32 within trench 30. For example, trench 30 can be considered as comprising a trench base 47, and conductive material 32 can be considered as being formed to have a portion 49 over and in contact with trench base 47. In the depicted example embodiment, none of covering material 36 is in contact with portion 49 of conductive material 32 that is over and in contact with trench base 47. Yet in other embodiments, some of covering material 36 may be formed in contact with portion 49 (not shown).

Covering material 36 may be formed to be of the same composition as that of an elevationally outermost portion of insulative material 22/24/26 (i.e., the same composition as material 26 in the depicted embodiment), or to be of different composition from that of an elevationally outermost portion of the insulative material. Further, covering material 36 might be formed to be any of one or a combination of insulative, conductive, and/or semiconductive. Example insulative materials include at least one of silicon nitride and undoped silicon dioxide. One example conductive covering material comprises W, for example in any of elemental, compound, and/or alloy forms. An example semiconductive material is polysilicon. Further and regardless, covering material 36 might comprise at least one of transparent carbon or amorphous carbon. Regardless, covering material 36 might comprise multiple layers and/or materials and be deposited, by way of example only, by any suitable CVD and/or ALD process, and whether existing or yet-to-be developed.

Figure 8:
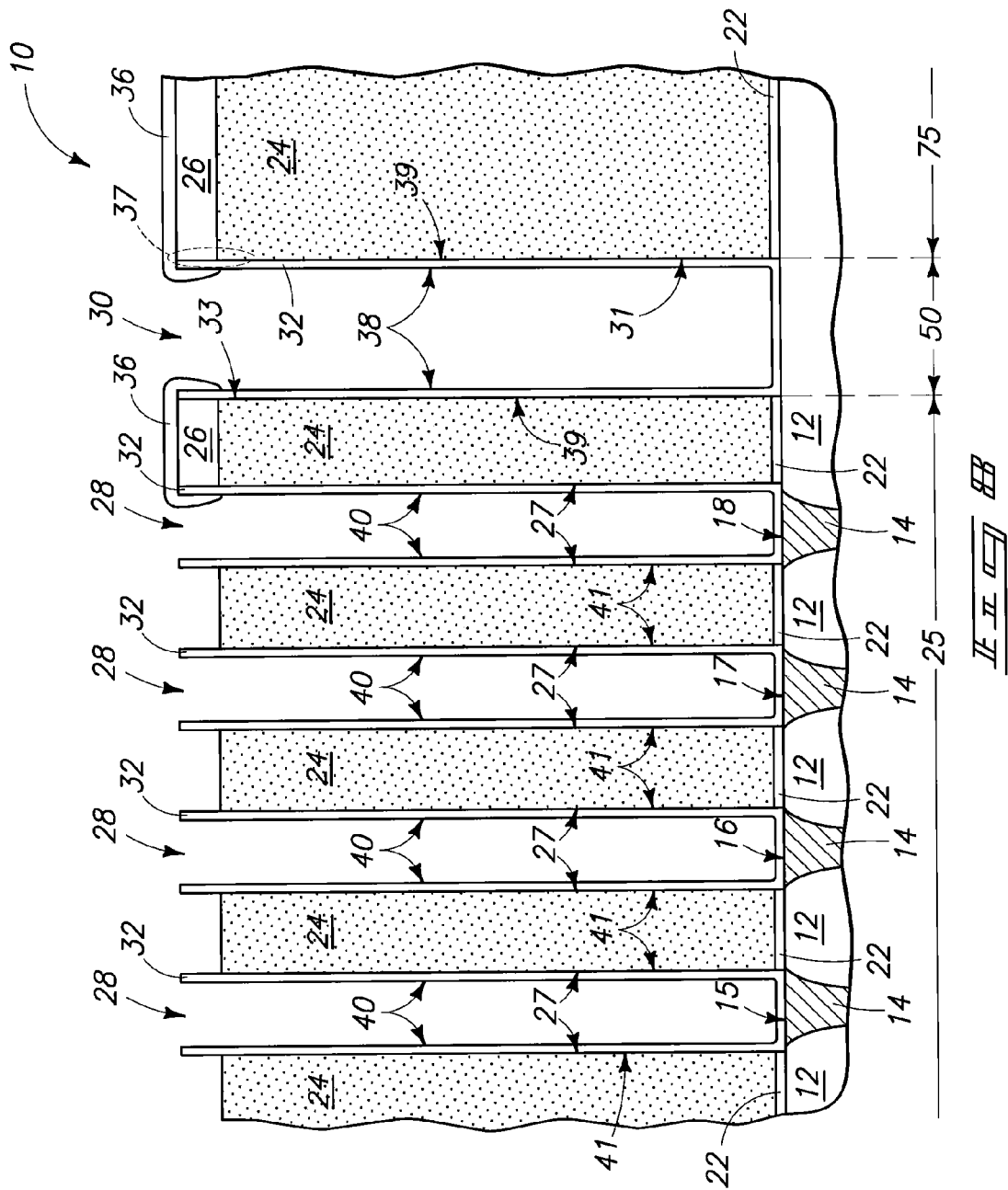
FIG. 8 is a view of the FIG. 7 substrate at a processing step subsequent to that shown by FIG. 7, and taken through line 8-8 in FIG. 9.
Figure 9:
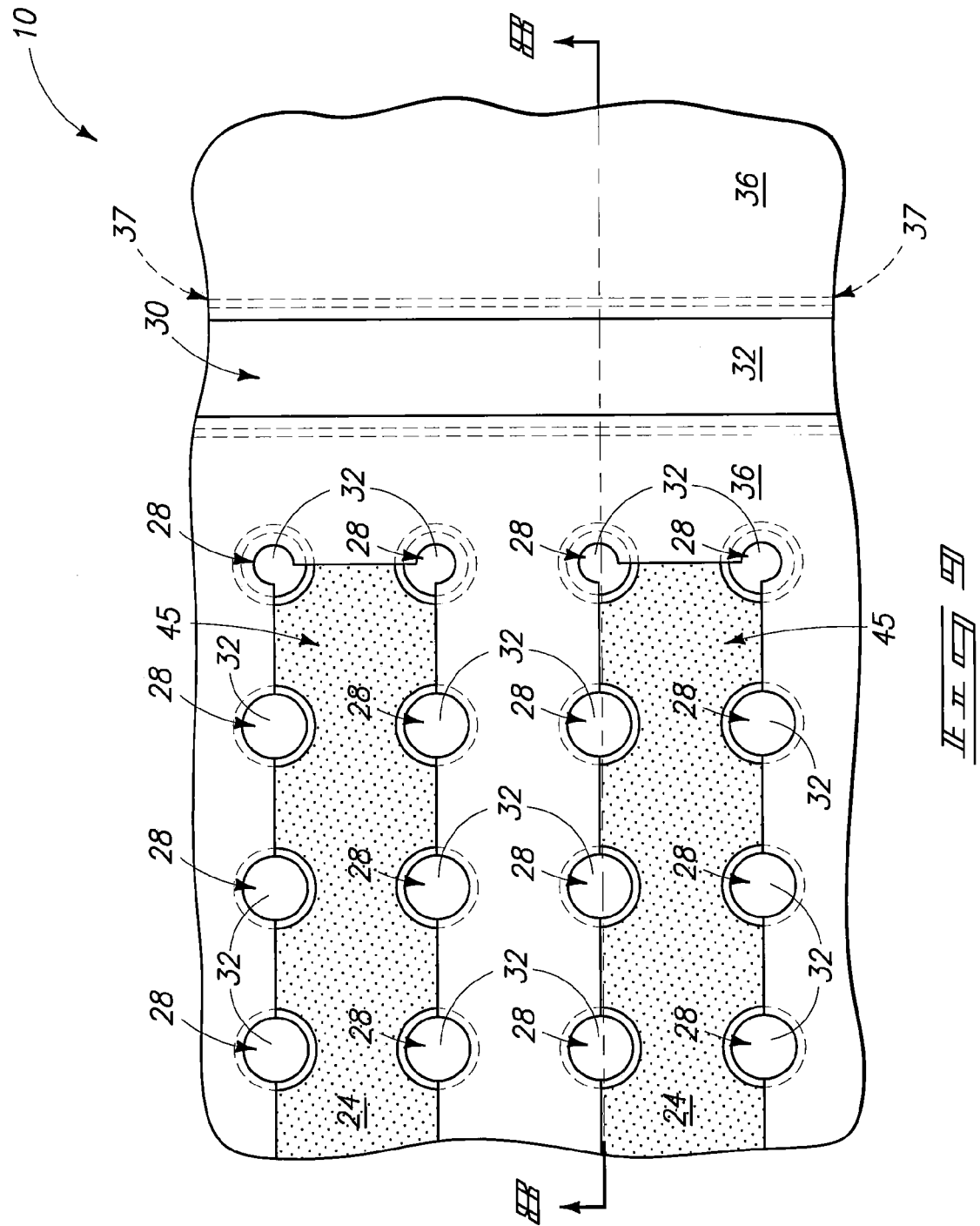
FIG. 9 is a diagrammatic top plan view of the FIG. 8 substrate fragment.

Referring to FIGS. 8 and 9, etch openings 45 have been formed through covering material 36 and insulator layer 26 within capacitor array area 25 effective to expose insulative material 24 within capacitor array area 25 while leaving elevationally outermost surfaces of insulative material 24 within circuitry area 75 completely covered with insulator layer 26 and covering material 36. Etch openings 45 provide access for liquid etchant to subsequently get to and etch material 24 within capacitor array area 25.

Figure 10:
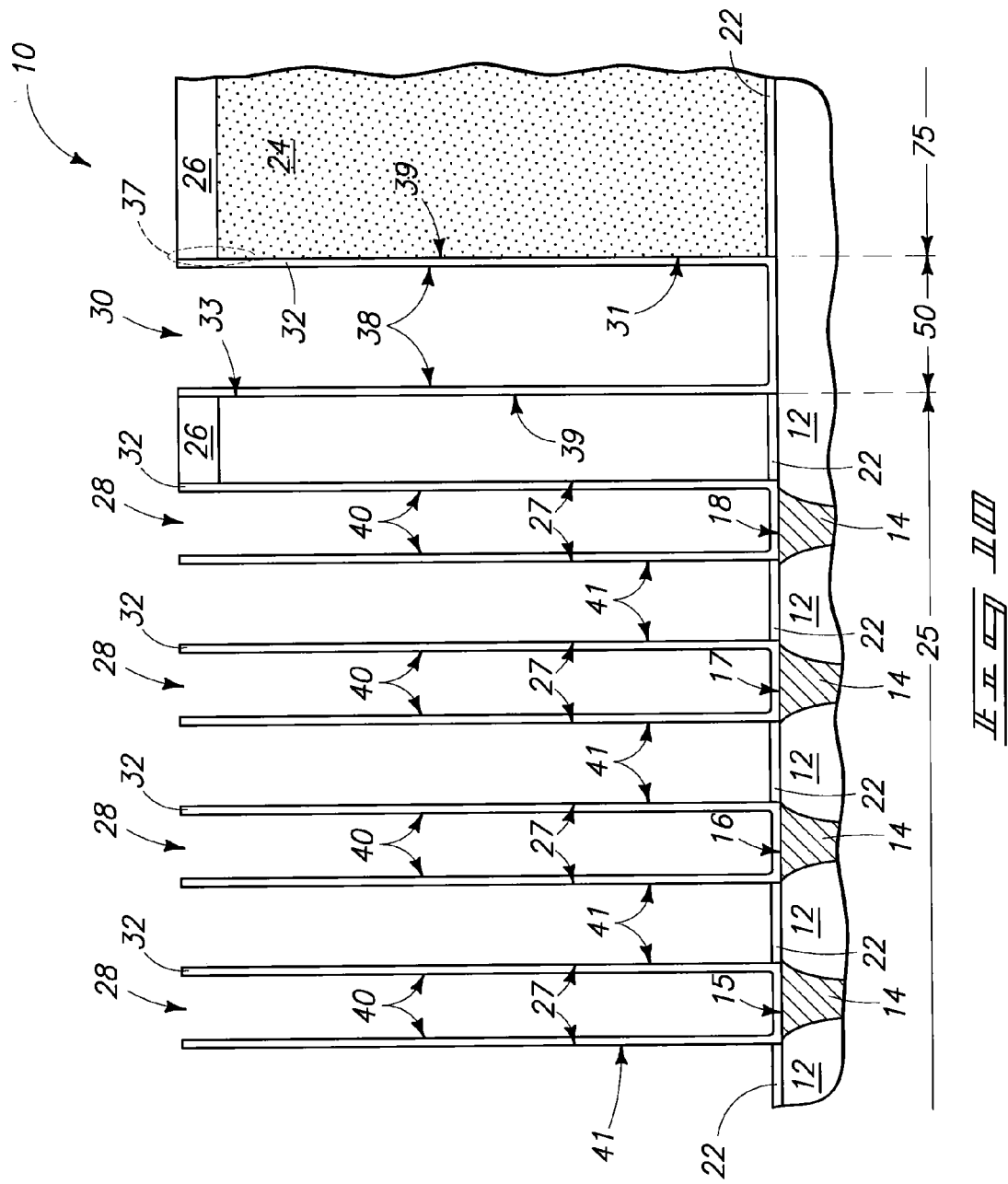
FIG. 10 is a view of the FIG. 8 substrate at a processing step subsequent to that shown by FIG. 8.
Figure 11:
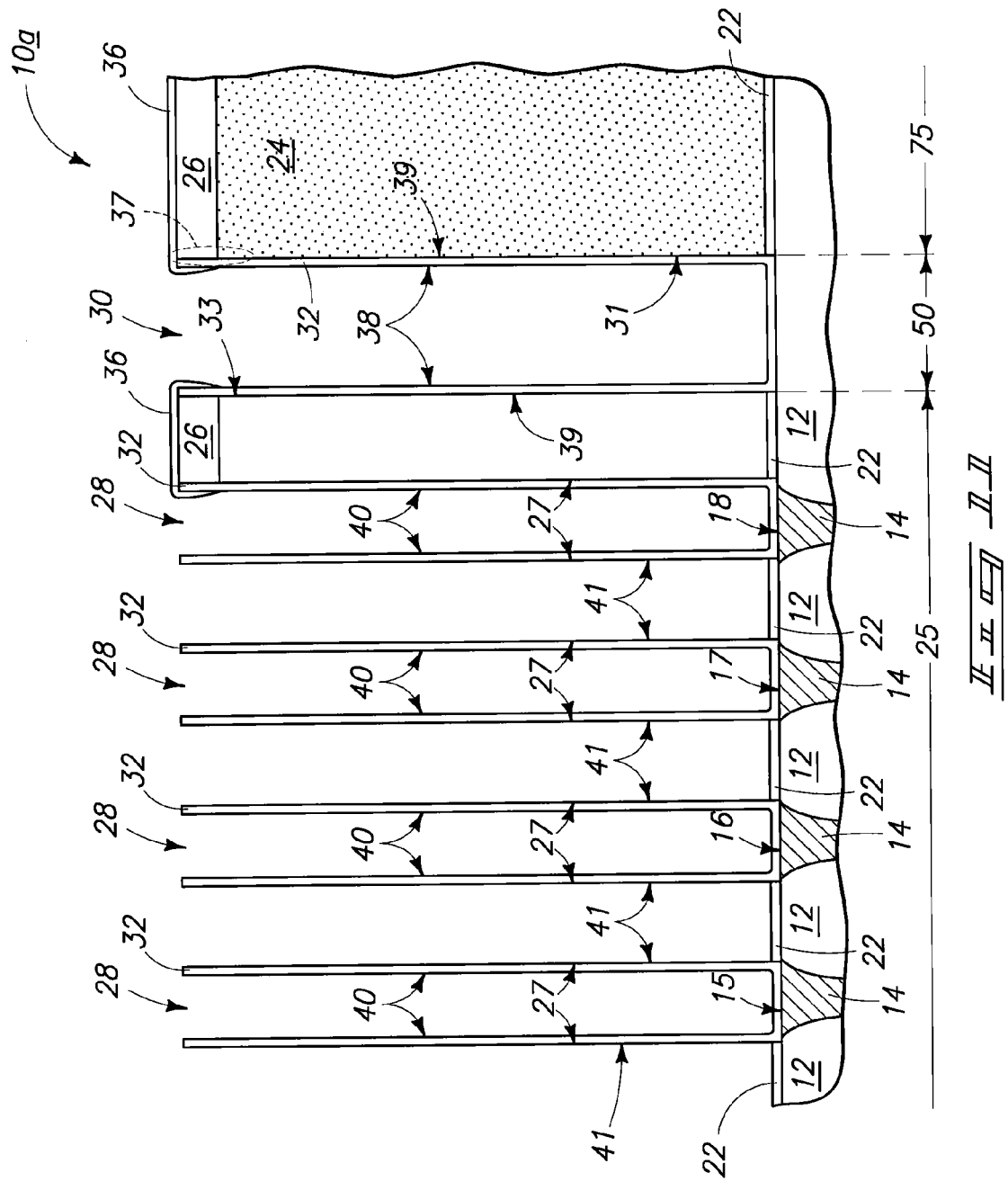
FIG. 11 is a view of an alternate processing of the FIG. 8 substrate to that depicted by FIG. 10.
Figure 11:
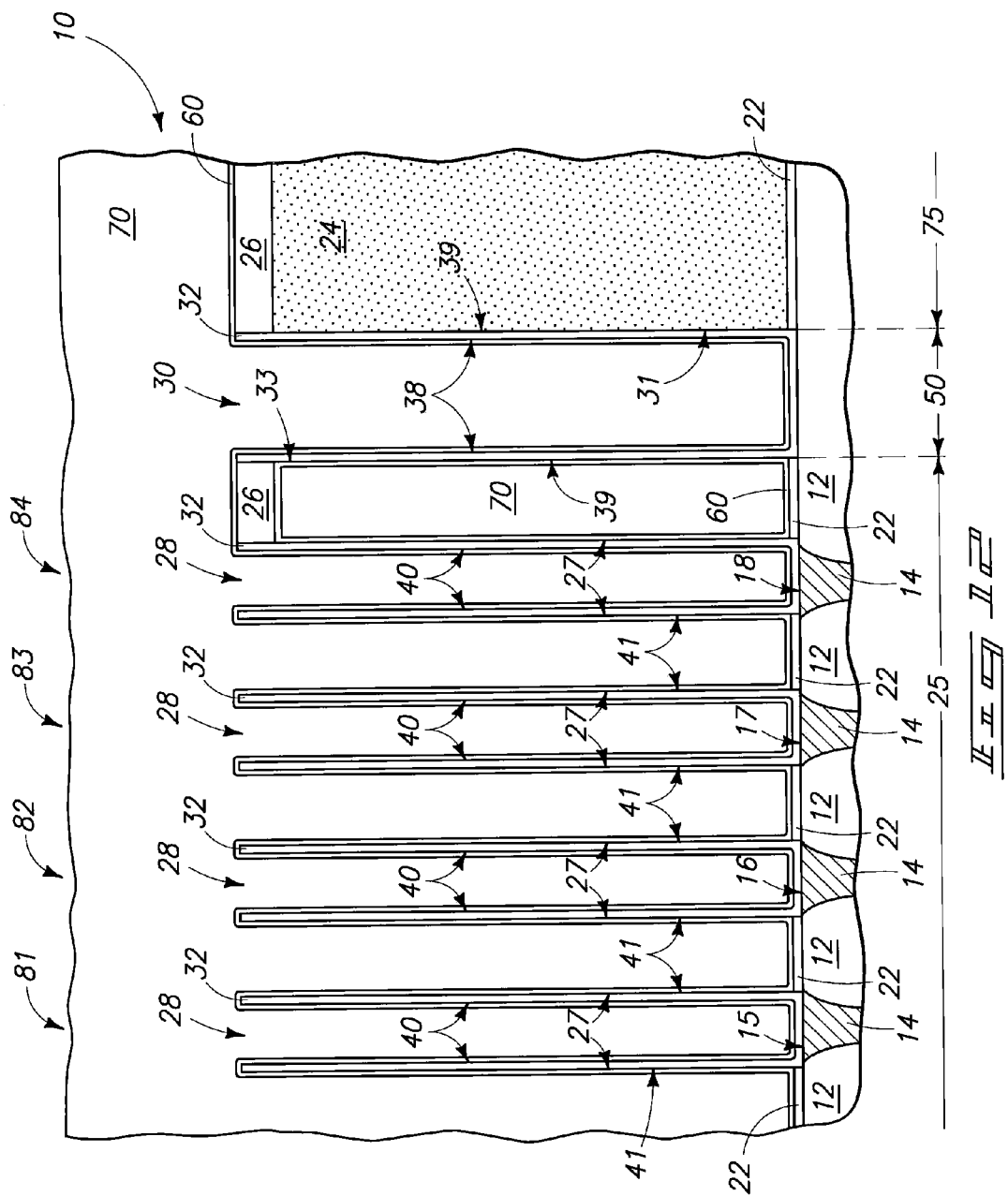

Referring to FIG. 10, insulative material 24 within capacitor array area 25 has been etched with a liquid etching solution effective to expose outer sidewall portions of outer sidewalls 41 of conductive material 32 within capacitor array area 25. The liquid etching solution during the etching of insulative material 24 may or may not also etch at least some of covering material 36 from substrate 10. Where the liquid etching solution during the etching of the insulative material also etches at least some of the covering material from the substrate, such might, by way of example only, etch less than 10% of the covering material from the substrate, etch at least a majority of the covering material from the substrate, or etch all of the covering material from the substrate. FIG. 10 depicts but one embodiment wherein the liquid etching solution has etched all of covering material 36 (not shown) from substrate 10. FIG. 11 depicts an alternate embodiment substrate 10a wherein the liquid etching solution during the etching of the insulative material has noticeably etched some, but not all, of covering material 36 from the substrate. Like numerals from the first described embodiment have been utilized where appropriate, with differences being indicated with the suffix "a". Accordingly, some of interface covering material 36 may or may not remain over the substrate at this point in the process, and/or in the resultant finished circuitry construction.

Where all of the covering material is etched from the substrate, such might be so completely etched prior to, in one embodiment, all of the insulative material that is etched by the liquid etching solution being etched from the substrate. In another embodiment, all of the interface covering material might be etched from the substrate after all of the insulative material that is etched by the liquid etching solution is etched from the substrate. Where all of the covering material is etched from the substrate by the liquid etching solution, it is more desirable that all of the insulative material that will be etched by the liquid etching solution be completely etched from the substrate prior to such occurring of the covering material, for example to keep interface 37 thereby covered with some material 36 to preclude risk of liquid etchant seeping through interface 37, for example intending to minimize or eliminate material 24 within circuitry area 75 from being etched thereby.

An example liquid etchant solution is aqueous, and regardless for example comprising HF. One example solution comprises 5:1 to 20:1 water to HF by volume, wherein said HF is a 42 weight percent solution of HF in water. An example etching temperature is room ambient, with an example etching pressure also being room ambient. However, temperatures and pressures below and above room ambient are also contemplated. Additional example HF-containing solutions might contain any one or combination of $HNO_3$, acetic acid, $NH_4F$, and propionic acid. Liquid etchant solutions other than HF-containing are also contemplated.

By way of example only, a 10:1 by volume water to HF solution per the above can be used to etch PSG at a rate of approximately 5,000 Angstroms/minute to 15,000 Angstroms/minute, while etching an example covering layer consisting essentially of silicon nitride at a rate from 20 Angstroms/minute to 80 Angstroms/minute. Accordingly, covering layer 36 material and thickness may be selected and optimized in conjunction with the selection and modifying of etch conditions and etch times such that a desired amount of covering layer 36 is removed during etch-back to expose the outer surfaces of the capacitor electrodes, and in one embodiment with a degree of over-etch such that all of covering material 36 is removed without damaging etch of insulative material 24 received over circuitry area by seeping action of liquid etchant along interface 37. Further considered, where covering material 36 comprises $Si_3N_4$ deposited by chemical vapor deposition, temperature at which such is deposited may impact density of the resultant layer and thereby resulting etch rate, for example in a HF solution. One embodiment, for example where it may be desired to remove all of covering material 36 before or after example removal of material 24 within capacitor array area 25, comprises chemical vapor depositing $Si_3N_4$ at a temperature of at least 550° C. to a thickness of from about 120 Angstroms to about 200 Angstroms. In another example embodiment, covering material 36 is formed at least in part by chemical vapor depositing $Si_3N_4$ at a temperature of no greater than 500° C. to a thickness of from about 300 Angstroms to about 600 Angstroms.

One embodiment of a method of forming a plurality of capacitors contemplates forming conductive covering material atop interface 37 independent of whether such is formed laterally over an upper portion of sidewalls of conductive material 32 within trench 30, and if so regardless of whether conductive covering material does not laterally cover an entirety of inner sidewalls 38 of conductive material 32. Regardless thereof in such embodiment, the insulative material within the capacitor array area and the conductive covering material are etched with a liquid etching solution effective to expose outer sidewalls portions of the conductive material within the capacitor array area and to remove all of the conductive covering material from the substrate. Example materials, methods, and constructions are otherwise, for example, as described above.

Conductive material 32 within capacitor array area 25 is incorporated into a plurality of capacitors. For example, FIG. 12 depicts the deposition of a capacitor dielectric layer 60. By way of example only, an example material is a silicon dioxide, silicon nitride, silicon dioxide composite, or any suitable high k dielectric, whether existing or yet-to-be developed. By way of example only, high k dielectrics include $Ta_2O_5$ and barium strontium titanate.

Figure 13:
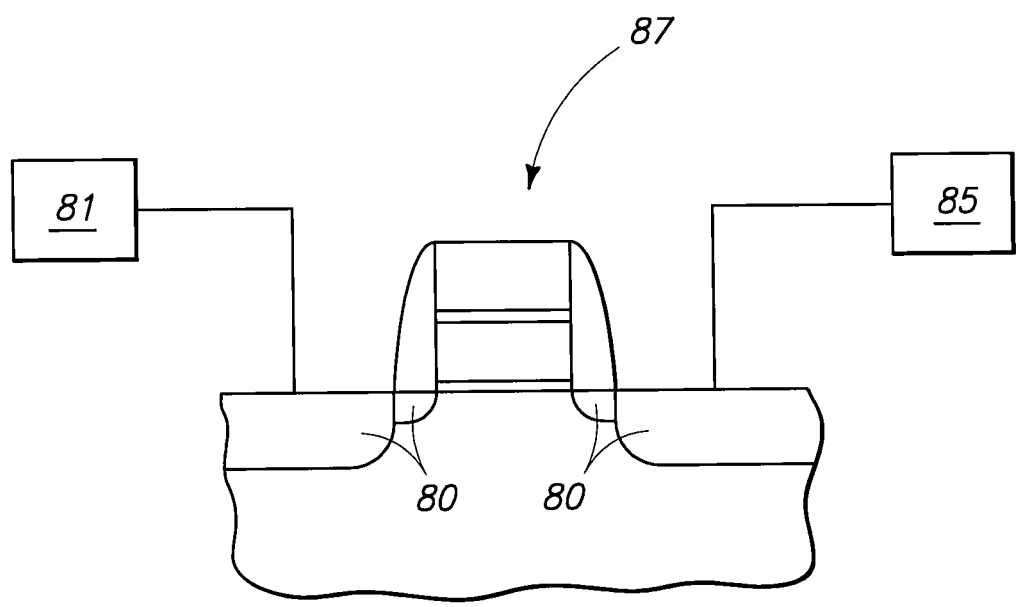
FIG. 13 is a diagrammatic representation of DRAM circuitry.

An outer capacitor electrode layer 70 has been deposited over capacitor dielectric layer 60, thereby defining capacitors 81, 82, 83 and 84. Such are depicted as comprising a common cell capacitor plate to all of the depicted capacitors, for example as might be utilized in DRAM or other circuitry. For example and by way of example only, FIG. 13 depicts an example DRAM cell incorporating capacitor 81. Such comprises an example transistor gate wordline 87 having insulative sidewall spacers, an insulative cap and a conductive region under the cap such as a silicide, a conductive polysilicon region under the silicide, and a gate dielectric region under the polysilicon. Source/drain regions 80 are shown formed within semiconductive material operatively proximate wordline 87. One of such electrically connects with capacitor 81, and another of such electrically connects with a bitline 85.

The above-described embodiment depicts at least some of layer 26 remaining as part of the finished circuitry construction. Further, any one or combination of the capacitor bracing structures referred to above in the "Background" section might be utilized. Alternately, no bracing might be utilized.

In compliance with the statute, the invention has been described in language more or less specific as to structural and methodical features. It is to be understood, however, that the invention is not limited to the specific features shown and described, since the means herein disclosed comprise example forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;

forming conductive material within the capacitor electrode openings and within the trench to line the capacitor electrode openings and the trench to less than completely fill the trench, the conductive material within the trench and the insulative material of the circuitry area having an elevationally outer interface laterally therebetween;

forming covering material atop the interface, over all of the circuitry area, and laterally over an upper portion of inner sidewalls of the conductive material within the trench, the covering material not laterally covering an entirety of the inner sidewalls of the conductive material within the trench;

etching the insulative material within the capacitor array area effective to expose outer sidewall portions of the conductive material within the capacitor array area, said etching of the insulative material beginning while the covering material is received over all of the circuitry area; and incorporating the conductive material within the capacitor array area into a plurality of capacitors.

2. The method of claim 1 comprising forming the covering material to be non-conformally deposited over the upper portion of the inner sidewalls of the conductive material to have at least two different lateral thicknesses therealong.

3. The method of claim 1 comprising forming the covering material to be of the same composition as that of an elevationally outermost portion of the insulative material.

4. The method of claim 1 comprising forming the covering material to be of different composition from that of an elevationally outermost portion of the insulative material.

5. The method of claim 1 comprising forming the covering material to be insulative.

6. The method of claim 5 comprising forming the covering material to comprise at least one of silicon nitride or undoped silicon dioxide.

7. The method of claim 1 comprising forming the covering material to be conductive.

8. The method of claim 7 comprising forming the covering material to comprise W.

9. The method of claim 1 comprising forming the covering material to be semiconductive.

10. The method of claim 9 comprising forming the covering material to comprise polysilicon.

11. The method of claim 1 comprising forming the covering material to comprise at least one of transparent carbon or amorphous carbon.

12. The method of claim 1 wherein the trench comprises a base, the conductive material being formed to have a portion over and in contact with the trench base, none of said covering material being in contact with said portion of conductive material that is over and in contact with the trench base.

13. The method of claim 1 comprising forming the covering material to a thickness of from about 50 Angstroms to about 1,000 Angstroms over the interface.

14. The method of claim 1 wherein the upper portion of the inner sidewalls over which the covering material is formed is no greater than 20% of depth of the trench within the insulative material.

15. The method of claim 1 wherein the upper portion of the inner sidewalls over which the covering material is formed is no greater than 10% of depth of the trench within the insulative material.

16. A method of forming a plurality of capacitors, comprising:

providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;

forming conductive material within the capacitor electrode openings and within the trench to line the capacitor electrode openings and the trench to less than completely fill the trench, the conductive material within the trench and the insulative material of the circuitry area having an elevationally outer interface laterally therebetween;

forming covering material atop the interface and laterally over an upper portion of inner sidewalls of the conductive material within the trench, the covering material not laterally covering an entirety of the inner sidewalls of the conductive material within the trench;

etching the insulative material within the capacitor array area with a liquid etching solution effective to expose outer sidewall portions of the conductive material within the capacitor array area, the liquid etching solution during the etching of the insulative material also etching at least some of the covering material from the substrate; and incorporating the conductive material within the capacitor array area into a plurality of capacitors.

17. The method of claim 16 wherein the liquid etching solution during the etching of the insulative material etches less than 10% of the covering material from the substrate.

18. The method of claim 16 wherein the liquid etching solution during the etching of the insulative material etches at least a majority of the covering material from the substrate.

19. The method of claim 16 wherein the liquid etching solution etches all of the covering material from the substrate.

20. The method of claim 19 comprising forming the covering material at least in part by chemical vapor depositing Si3N4 at a temperature of at least 550° C., the Si3N4 being deposited to a thickness of from about 120 Angstroms to about 200 Angstroms.

21. The method of claim 19 comprising forming the covering material at least in part by chemical vapor depositing Si3N4 at a temperature of no greater than 500° C., the Si3N4 being deposited to a thickness of from about 300 Angstroms to about 600 Angstroms.

22. The method of claim 19 wherein all of the insulative material that is etched by the liquid etching solution is etched from the substrate prior to all of the covering material being etched from the substrate.

23. The method of claim 19 wherein all of the covering material is etched from the substrate prior to all of the insulative material that is etched by the liquid etching solution being etched from the substrate.

24. A method of forming a plurality of capacitors, comprising:

providing a substrate comprising a capacitor array area, a circuitry area other than the capacitor array area, and an intervening area between the capacitor array area and the circuitry area; an insulative material received over the capacitor array area and the circuitry area, the capacitor array area comprising a plurality of capacitor electrode openings within the insulative material received over individual capacitor storage node locations, the intervening area comprising a trench within the insulative material;

forming conductive material within the capacitor electrode openings and within the trench to line the capacitor electrode openings and the trench to less than completely fill the trench, the conductive material within the trench and the insulative material of the circuitry area having an elevationally outer interface laterally therebetween;

forming covering material atop the interface and laterally over an upper portion of inner sidewalls of the conductive material within the trench, the covering material not laterally covering an entirety of the inner sidewalls of the conductive material within the trench;

etching the insulative material within the capacitor array area with a liquid etching solution effective to expose outer sidewall portions of the conductive material within the capacitor array area, wherein the insulative material comprises silicon dioxide comprising at least one of phosphorus and boron, and the liquid etching solution comprises HF; and incorporating the conductive material within the capacitor array area into a plurality of capacitors.

25. A method of forming a plurality of capacitors, comprising:

providing a substrate comprising a capacitor array area, a peripheral circuitry area other than the capacitor array area, and an intervening area between the capacitor array area and the peripheral circuitry area; a doped silicon dioxide material received over the capacitor array area and the peripheral circuitry area, an insulator layer other than doped silicon dioxide received over the doped silicon dioxide material within the capacitor array area and the circuitry area, the capacitor array area comprising a plurality of capacitor electrode openings within the insulator layer and the doped silicon dioxide material which are received over individual capacitor storage node locations, the intervening area comprising a trench within the insulator layer and the doped silicon dioxide material that completely surrounds the capacitor array area;

forming conductive material within the capacitor electrode openings and within the trench to line the capacitor electrode openings and the trench to less than completely fill the capacitor electrode openings and the trench, the conductive material within the trench and the insulator layer of the circuitry area having an elevationally outer interface laterally therebetween;

forming covering material over the insulator layer atop the interface and laterally over an upper portion of inner sidewalls the conductive material within the trench, the covering material not laterally covering an entirety of the inner sidewalls of the conductive material within the trench;

forming etch openings through the covering material and the insulator layer within the capacitor array area effective to expose the doped silicon dioxide material within the capacitor array area while leaving elevationally outermost surfaces of the doped silicon dioxide material within the peripheral circuitry area completely covered with the covering material and the insulator layer;

etching the doped silicon dioxide material within the capacitor array area through the etch openings with a liquid etching solution effective to expose outer sidewall portions of the conductive material within the capacitor array area, the liquid etching solution during the etching of the insulator layer also etching at least some of the covering material from the substrate; and incorporating the conductive material within the capacitor array area into a plurality of capacitors.

26. The method of claim 25 comprising forming the covering material to be non-conformally deposited over the upper portion of the inner sidewalls of the conductive material to have at least two different lateral thicknesses therealong.

* * * * *